US010797449B2

(12) United States Patent
Chuang et al.

(10) Patent No.: US 10,797,449 B2
(45) Date of Patent: Oct. 6, 2020

(54) CONNECTOR HAVING ONE-PIECE HOUSING

(71) Applicants: NICECONN TECHNOLOGY CO., LTD., New Taipei (TW); Yi-Fang Chuang, New Taipei (TW); Nai-Chien Chang, New Taipei (TW)

(72) Inventors: Yi-Fang Chuang, New Taipei (TW); Nai-Chien Chang, New Taipei (TW)

(73) Assignees: NICECONN TECHNOLOGY CO., LTD., New Taipei (TW); Yi-Fang Chuang, New Taipei (TW); Nai-Chien Chang, New Taipei (TW)

( * ) Notice: Subject to any disclaimer, the term of this patent is extended or adjusted under 35 U.S.C. 154(b) by 0 days.

(21) Appl. No.: 16/293,387

(22) Filed: Mar. 5, 2019

(65) Prior Publication Data

US 2020/0287335 A1   Sep. 10, 2020

(51) Int. Cl.
*H01R 24/60* (2011.01)
*H01R 12/57* (2011.01)
*H01R 12/71* (2011.01)
*H05K 1/11* (2006.01)
*H01R 13/66* (2006.01)
*H01R 107/00* (2006.01)

(52) U.S. Cl.
CPC .......... *H01R 24/60* (2013.01); *H01R 12/57* (2013.01); *H01R 12/716* (2013.01); *H01R 13/6658* (2013.01); *H05K 1/117* (2013.01); *H01R 2107/00* (2013.01); *H05K 2201/10189* (2013.01)

(58) Field of Classification Search
CPC ...... H01R 24/60; H01R 12/57; H01R 12/716; H01R 13/6658
USPC .............................. 439/626, 901, 620.1, 350
See application file for complete search history.

(56) References Cited

U.S. PATENT DOCUMENTS

| 6,062,911 | A  | * | 5/2000 | Davis | H01R 13/2492 439/630 |
| 6,511,345 | B1 | * | 1/2003 | Hwang | H01R 12/707 439/541.5 |
| 6,752,662 | B2 | * | 6/2004 | Okamoto | H05K 3/3405 439/607.04 |
| 7,883,369 | B1 | * | 2/2011 | Sun | H01R 12/7011 439/607.35 |
| 7,909,654 | B2 | * | 3/2011 | He | H01R 13/6658 439/607.22 |

(Continued)

*Primary Examiner* — Peter G Leigh
(74) *Attorney, Agent, or Firm* — Chun-Ming Shih; HDLS IPR Services (57) ABSTRACT

A connector having a one-piece housing includes a metal sleeve and a circuit board. The metal sleeve is open at both ends thereof and the metal sleeve integrally extends along its circumferential direction. A part of the metal sleeve is narrow than other parts and a neck is formed thereon. A tongue is formed protruding from an edge of the circuit board and multiple terminals are printed on at least a surface of the tongue. A part of the circuit board is interference fit in the neck of the metal sleeve, and the tongue is accommodated in the metal sleeve. The tongue is surrounded by the metal sleeve and is spaced apart from an inner wall of the metal sleeve. The tongue is ensured to be separated from electromagnetic interferences by the metal sleeve to ensure efficiency and stability of the signal transmitted in the terminal.

11 Claims, 6 Drawing Sheets

(56) References Cited

U.S. PATENT DOCUMENTS

| | | | |
|---|---|---|---|
| 8,100,699 B1* | 1/2012 | Costello | H01R 12/7082 439/541.5 |
| 8,215,981 B2* | 7/2012 | Liu | G06F 13/409 361/679.54 |
| 8,251,750 B2* | 8/2012 | Sun | H01R 13/035 439/638 |
| 8,360,809 B2* | 1/2013 | Chou | H01R 13/6658 439/620.21 |
| 8,366,491 B2* | 2/2013 | Wu | H01R 12/55 439/660 |
| 8,721,370 B2* | 5/2014 | Liu | H01R 13/6658 439/660 |
| 8,734,182 B2* | 5/2014 | Peng | H05K 5/0278 439/607.01 |
| 8,749,980 B2* | 6/2014 | Won | G06F 1/20 174/258 |
| 8,794,981 B1* | 8/2014 | Rodriguez | H01R 13/405 439/76.1 |
| 8,979,594 B2* | 3/2015 | Tsai | H01R 13/6658 439/660 |
| 9,130,297 B2* | 9/2015 | Xiao | H01R 13/512 |
| 9,160,129 B2* | 10/2015 | Brickner | B24B 41/06 |
| 9,263,829 B2* | 2/2016 | Wu | H01R 13/6271 |
| 9,385,472 B2* | 7/2016 | Yen | H01R 13/6275 |
| 9,728,876 B1* | 8/2017 | Shiue | H01R 12/725 |
| 9,853,402 B2* | 12/2017 | Talalayev | H01R 13/6583 |
| 9,905,944 B2* | 2/2018 | Little | H01R 13/6658 |
| 9,979,134 B2* | 5/2018 | Yu | H01R 13/6585 |
| 10,135,164 B1* | 11/2018 | Shih | H01R 12/716 |
| 10,236,609 B2* | 3/2019 | Tziviskos | H01R 13/516 |
| 2005/0026469 A1* | 2/2005 | Ice | G02B 6/4277 439/76.1 |
| 2007/0127223 A1* | 6/2007 | Mitsuhashi | G06K 19/07732 361/752 |
| 2009/0052142 A1* | 2/2009 | Brewer | H05K 1/144 361/721 |
| 2014/0069709 A1* | 3/2014 | Schmidt | H01R 13/6581 174/520 |
| 2016/0249489 A1* | 8/2016 | Wakana | H01R 12/721 |
| 2018/0097311 A1* | 4/2018 | Ju | H01R 13/04 |
| 2018/0131111 A1* | 5/2018 | Tziviskos | H01R 13/516 |
| 2018/0138646 A1* | 5/2018 | Chuang | H05K 1/117 |
| 2018/0183184 A1* | 6/2018 | Tsai | H01R 13/631 |
| 2018/0279491 A1* | 9/2018 | Yasui | H05K 5/0026 |
| 2019/0052024 A1* | 2/2019 | Zhao | H01R 13/6585 |
| 2019/0081422 A1* | 3/2019 | Chuang | H05K 1/117 |

* cited by examiner

CONNECTOR HAVING ONE-PIECE HOUSING

TECHNICAL FIELD

The present disclosure relates to a connector, in particular to a connector having a one-piece housing.

BACKGROUND

A conventional connector usually includes a metal housing and a terminal block arranged in the metal housing, multiple terminals are arranged in the terminal block for coupling, and the metal housing could be used for coupling with another corresponding connector, grounding, and shielding electrical signal interference. The metal housing is usually made of a metal sheet, and the metal sheet is bent by a sheet metal process to form a tube sleeve or ring for accommodating the terminal block therein. However, a current connector is tiny, electrical signals could pass a gap on the metal housing, and efficiency and stability of the signal transmitted in the connector are decreased by electromagnetic interference.

In views of this, in order to solve the above disadvantage, the present inventor studied related technology and provided a reasonable and effective solution in the present disclosure.

SUMMARY

A connector having a one-piece housing is provided in the present disclosure.

A connector having a one-piece housing including a metal sleeve and a circuit board is provided in the present disclosure. The metal sleeve is open at both ends and the metal sleeve integrally extends along its circumferential direction. A part of the metal sleeve is narrow than other parts and a neck is formed thereon. A tongue is formed protruding from an edge of the circuit board and multiple terminals are printed on at least a surface of the tongue. A part of the circuit board is interference fit in the neck of the metal sleeve, and the tongue is accommodated in the metal sleeve.

According to the connector having the one-piece housing of the present disclosure, an interference fitting segment connected with the tongue is formed on the circuit board, the interference fitting segment is inserted in and interference fit with the neck. A notch is formed at the edge of the circuit board, and the interference fitting segment is formed in the notch and connected between the tongue and the notch. A hook is extended from the tongue.

The connector having the one-piece housing of the present disclosure further could include an insulation base stacked on one surface of the circuit board.

According to the connector having the one-piece housing of the present disclosure, multiple legs electrically connected to the respective terminals are arranged in the insulation base. An elastic arm is arranged on the metal sleeve, and the elastic arm extends into the metal sleeve. A latch is arranged on the metal sleeve, and the latch is arranged protruding into the metal sleeve.

According to the connector having the one-piece housing of the present disclosure, the tongue is accommodated in one end of the metal sleeve, the neck is formed on the other end of the metal sleeve, and the circuit board is disposed protruding from the metal sleeve.

According to the connector having the one-piece housing of the present disclosure, the neck is formed at a middle segment of the metal sleeve. The tongue could be accommodated in one end of the metal sleeve, and the circuit board is accommodated in the other end of the metal sleeve.

According to the connector having the one-piece housing of the present disclosure, the terminals are disposed on two surfaces of the tongue, and an arrangement of the terminals is compatible with USB Type C specifications. A slot is defined in the neck.

According to the connector having the one-piece housing of the present disclosure, the metal sleeve integrally extends along its circumferential direction. Therefore, the metal seamless, and the tongue is thereby ensured to be separated from electromagnetic interferences by the metal sleeve to ensure efficiency and stability of the signal transmitted in the terminal.

BRIEF DESCRIPTION OF DRAWING

The present disclosure can be more fully understood by reading the following detailed description of the embodiment, with reference made to the accompanying drawings as follows.

DETAILED DESCRIPTION

According to FIGS. 1 to 4, a connector having a one-piece housing including a metal sleeve 100 and a circuit board 200 is provided in an embodiment of the present disclose.

The metal sleeve 100 is preferably a one piece formed flat tube made by extrusion process, the metal sleeve 100 is open at both ends and the metal sleeve 100 integrally extended along a circumferential direction thereof, a part of the metal sleeve 100 is narrow than other parts of the metal sleeve 100 and to form a neck 110, and a slot is preferably defined in the neck 110. The neck 110 could be formed by compressing the metal sleeve 100 and alternatively by expanding other parts of the metal sleeve 100, and scope of the present disclosure should not be limited to the embodiments. One end of the metal sleeve 100 is allowed another corresponding connector (not shown in Figs.) to be inserted therein and coupled therewith. According to the present embodiment, the neck 110 is preferably formed on the other end of the metal sleeve 100, but scope of the present disclosure should not be limited to the embodiments. An elastic arm 120 is arranged on the metal sleeve 100, and the elastic arm 120 could be preferably formed by punching through the metal sleeve 100, and the elastic arm 120 extends into the metal sleeve 100 for clamping the coupled connector. A latch 130 is arranged on the metal sleeve 100, and the latch 130 is arranged protruding into the metal sleeve 100 for catching the coupled connector, the latch 130 could be preferably formed by punching the metal sleeve 100 to deform toward inside of the metal sleeve 100.

A tongue 210 is formed protruding from an edge of circuit board 200, multiple terminals 230 are printed on at least a surface of the tongue 210, according to the USB Type C connector shown in the present embodiment, the terminals 230 are disposed on two surfaces of the tongue 210, and an arrangement of the terminals 230 are compatible with USB Type C specification. However, the terminals 230 could be disposed according to various alternative specifications, and scope of the present disclosure should not be limited to the embodiments. A part of the circuit board 200 is interference fit in the neck 110 of the metal sleeve 100 and the tongue 210 is thereby fixed on the metal sleeve 100. The tongue 210 is accommodated in the metal sleeve 100, and the tongue 210 is preferably surrounded by the metal sleeve 100 and spaced apart from an inner wall of the metal sleeve 100. According to the present embodiment, a notch 201 is formed at an inner edge of notch 20, and the interference fitting segment 220 is connected between the tongue 210 and the notch 201, a maximum width of the tongue 210 is less than a maximum width of the interference fitting segment 220, the tongue 210 is inserted into the metal sleeve 100 through the neck 110 of the metal sleeve 100, and the neck 110 of the metal sleeve 100 is interference fit with the interference fitting segment 220 and the tongue 210 is thereby fixed in the metal sleeve 100. The tongue 210 is accommodated in one end of the metal sleeve 100 for coupling with the coupled connector, the tongue 210 preferably extends along a longitudinal direction of the metal sleeve 100, the terminals 230 tongue 210 are allowed to be contacted with and electrically connected with the coupled connector, and a hook 211 for catching the coupled connector is extended from an edge of the tongue 210 along a lateral direction of the tongue 210.

Figure 1:
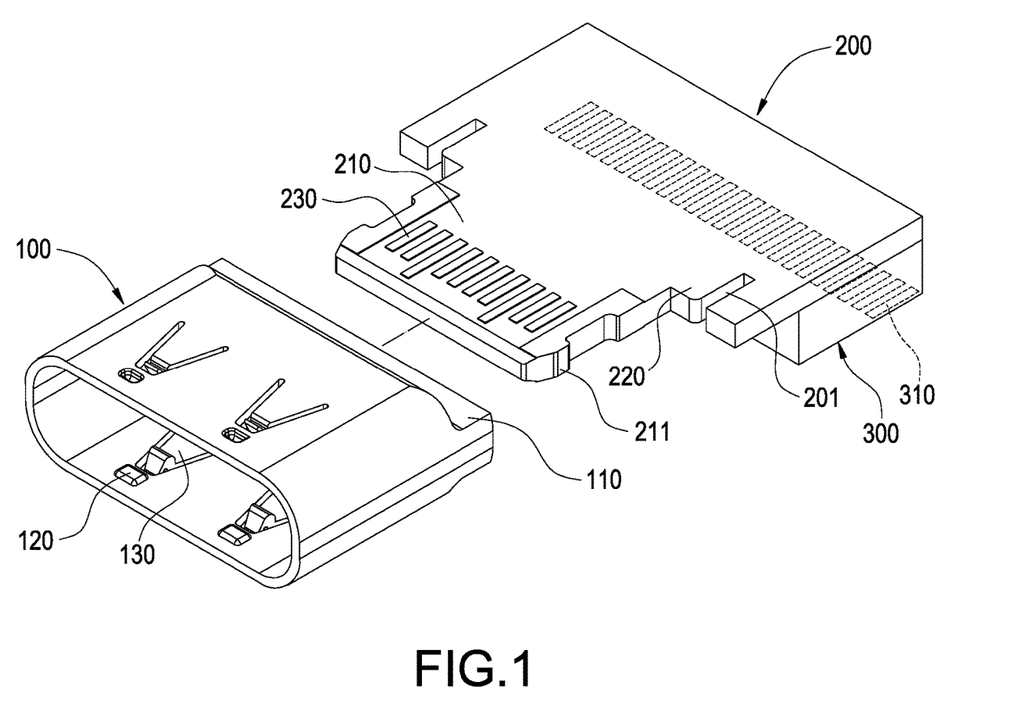
FIG. 1 is an exploded view showing a connector having the one-piece housing according to an embodiment of the present disclosure.
Figure 2:
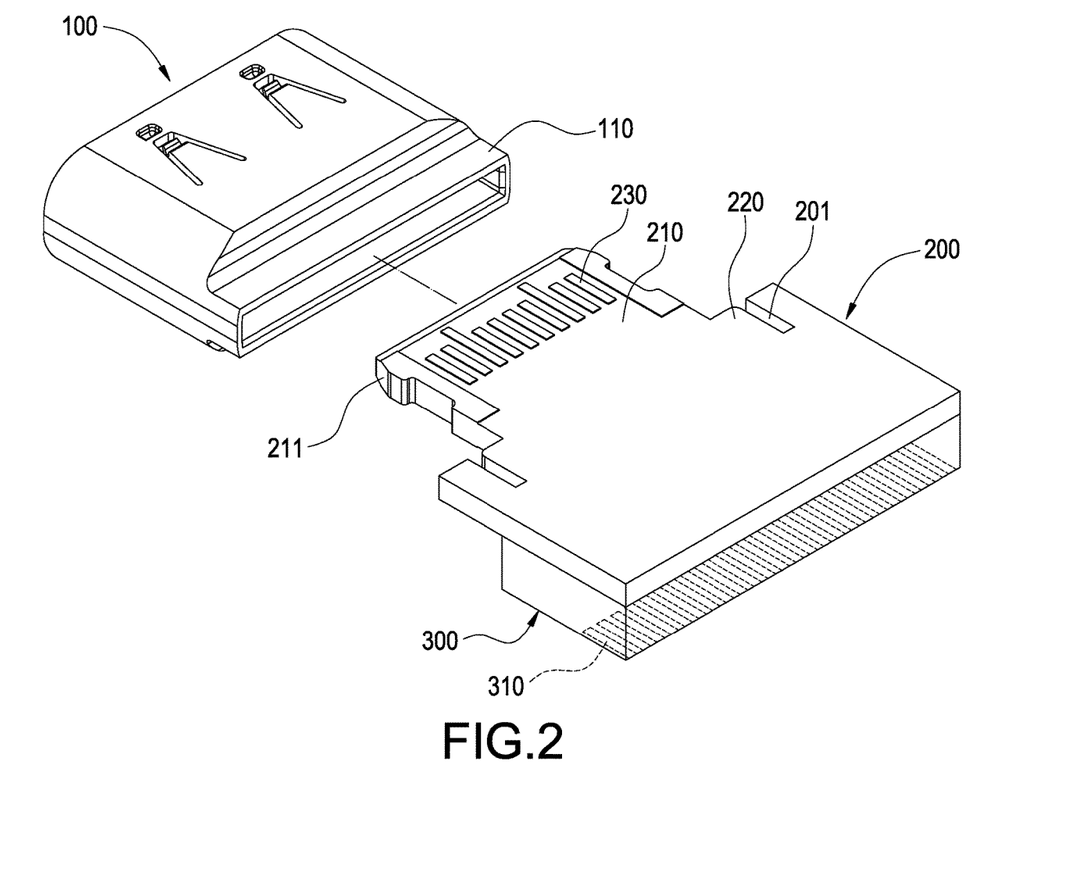
FIGS. 2 to 3 are perspective views showing the connector having the one-piece housing according to the aforementioned embodiment of the present disclosure.
Figure 3:
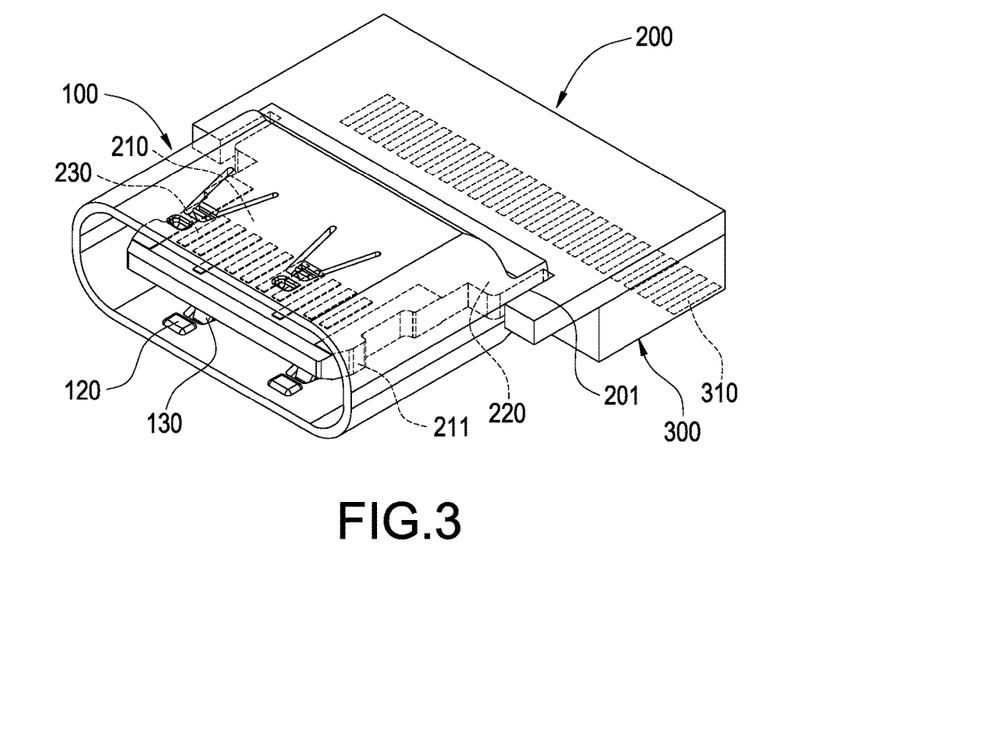
Figure 4:
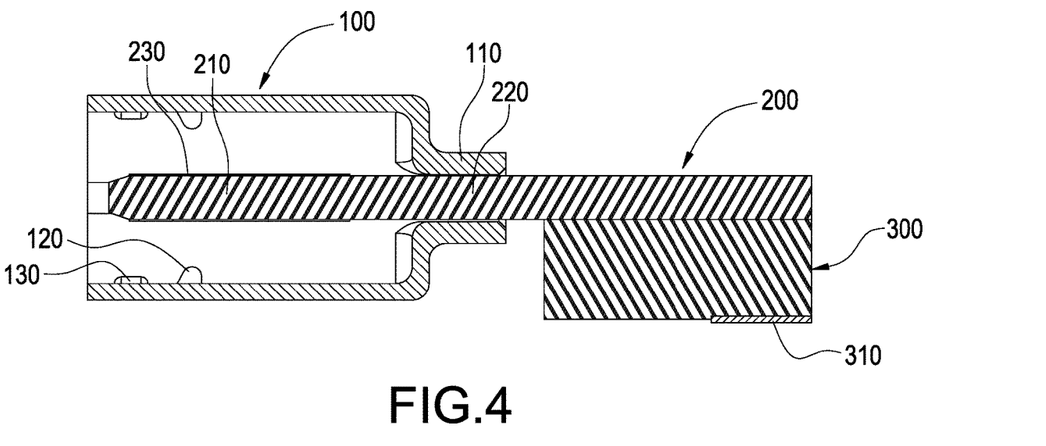
FIG. 4 is a cross sectional view showing the connector having the one-piece housing according to the aforementioned embodiment of the present disclosure.
Figure 5:
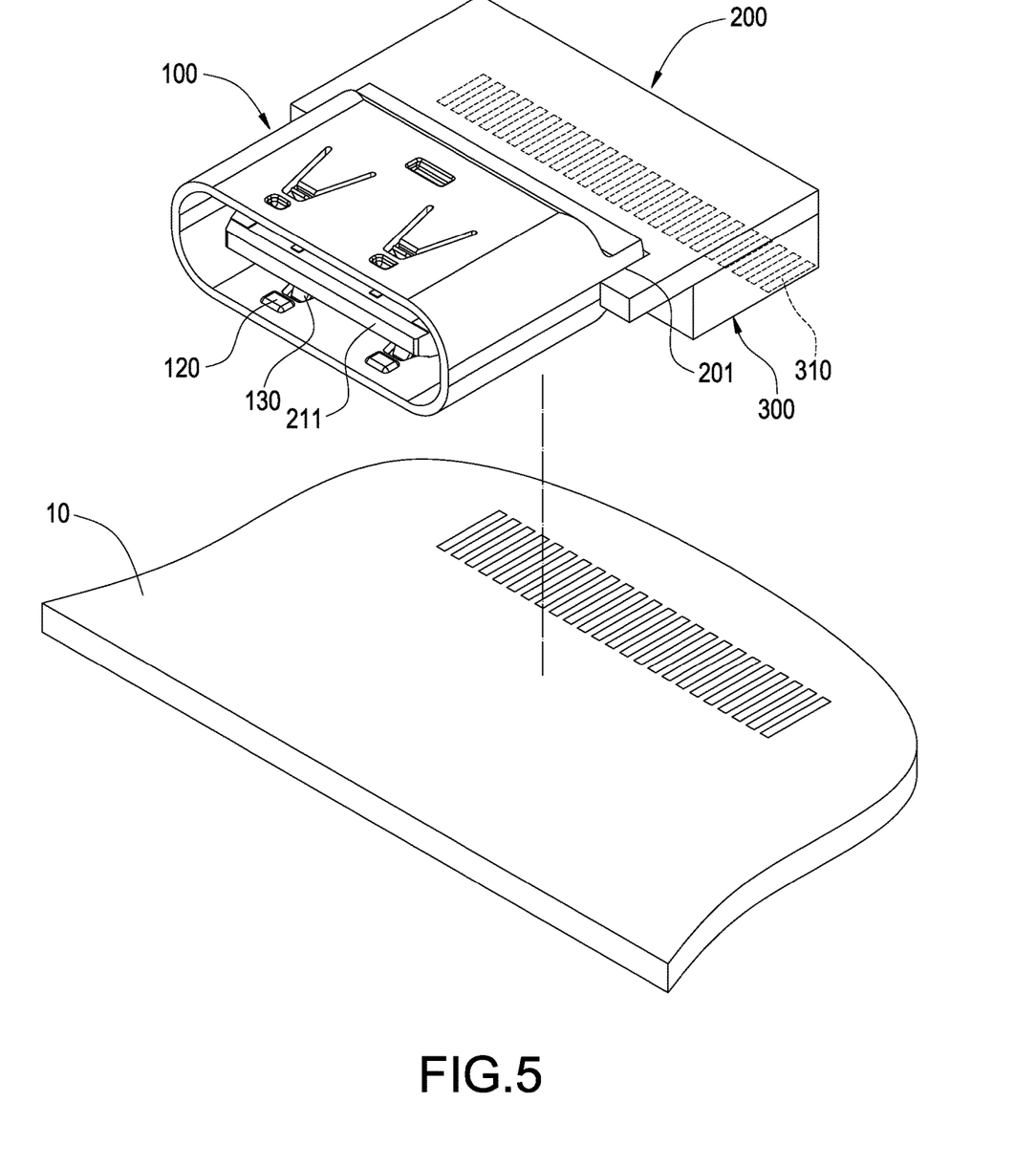
FIGS. 5 to 7 are schematic views showing arrangements of the connector having the one-piece housing according to the aforementioned embodiment of the present disclosure.
Figure 6:
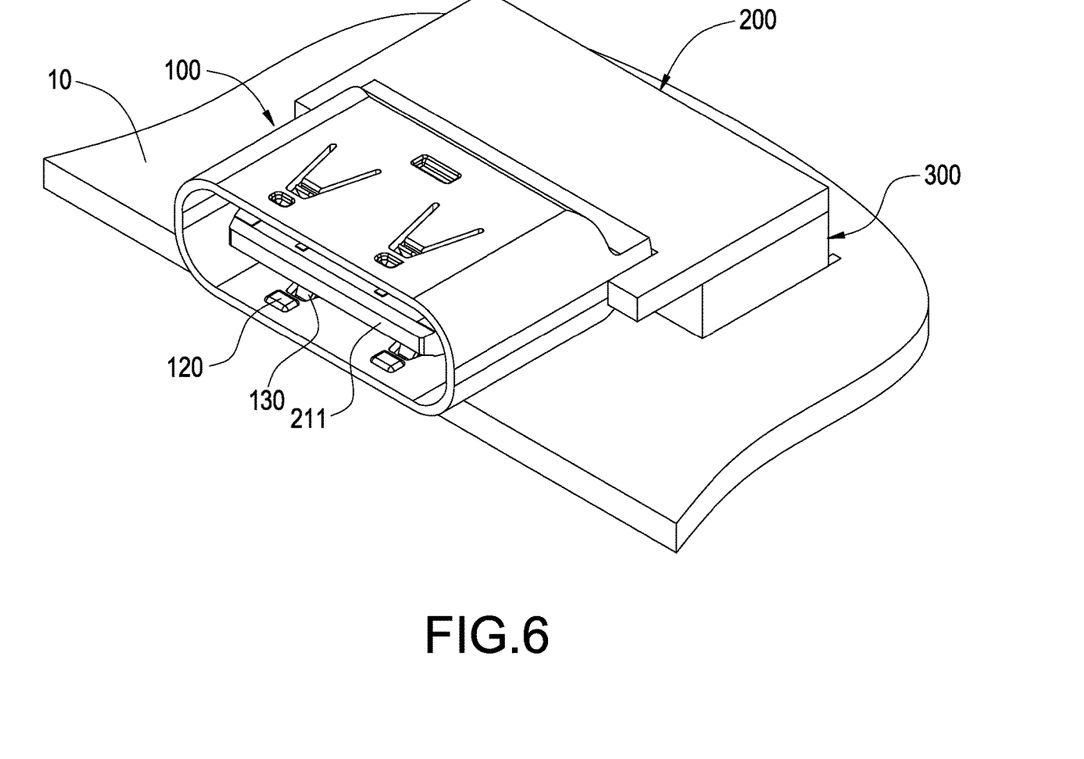
Figure 7:
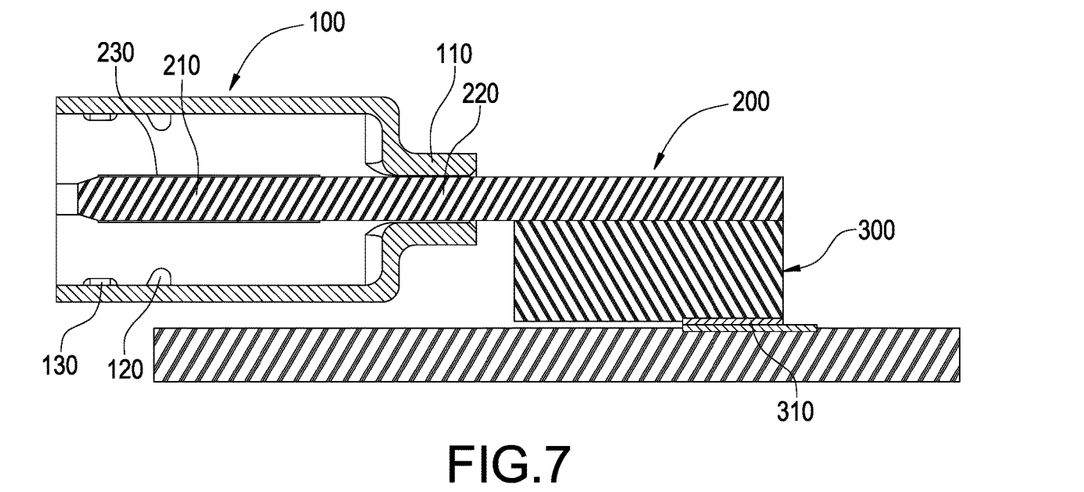

According to FIGS. 5 to 7, the other parts of the circuit board 200 are allowed to be electrically connected with an electronic device and arranged protruding from the end of the metal sleeve 100 which the neck 110 is formed thereon. The circuit board 200 could be soldered with a mother board of the electronic device, but scope of the present disclosure should not be limited to the embodiment. For example, an insulation base 300 could be stacked on a surface of the circuit board 200, multiple legs 310 could be embedded in the insulation base 300, one end of the respective legs 310 could be soldered circuit board 200 and thereby electrically connected to the respective terminals 230, and the other end of the respective legs 310 are arranged protruding from the insulation base 300 and for soldering with the mother board of the electronic device.

Figure 8:
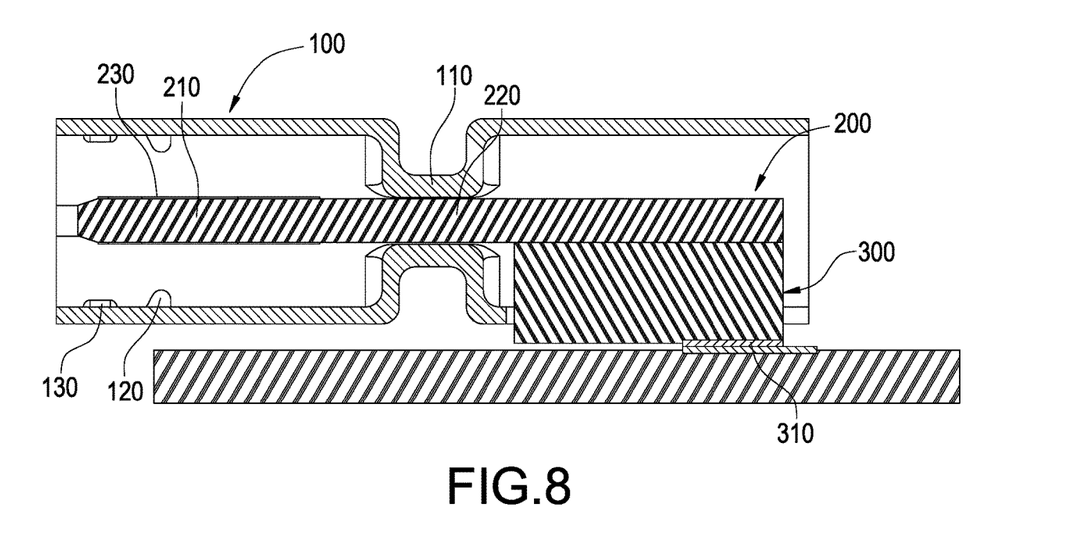
FIG. 8 is a schematic view showing a connector having a one-piece housing according to another embodiment of the present disclosure.

According to FIG. 8, a connector having a one-piece housing including a metal sleeve 100 and a circuit board 200 is provided in an embodiment of the present disclose.

The metal sleeve 100 is preferably a one piece formed flat tube made by extrusion process, the metal sleeve 100 is open at both ends and the metal sleeve 100 integrally extended along a circumferential direction thereof, and a part of the metal sleeve 100 is narrow than other parts of the metal sleeve 100 to form a neck 110. One end of the metal sleeve 100 is allowed another corresponding connector to be inserted therein and coupled therewith, according to the present embodiment, the neck 110 is preferably formed at a middle segment of the metal sleeve 100. An elastic arm 120 is arranged on the metal sleeve 100, the elastic arm 120 could be preferably formed by punching through the metal sleeve 100, and the elastic arm 120 extends into the metal sleeve 100 for clamping the coupled connector. A latch 130 is arranged on the metal sleeve 100, the latch 130 is arranged protruding into the metal sleeve 100 for catching the coupled connector, and the latch 130 could be preferably formed by punching the metal sleeve 100 to deform toward inside of the metal sleeve 100.

A tongue 210 is formed protruding from an edge of circuit board 200, multiple terminals 230 are printed on at least a surface of the tongue 210, a part of the circuit board 200 is interference fit in the neck 110 of the metal sleeve 100, and the tongue 210 is thereby fixed on the metal sleeve 100. The tongue 210 is accommodated in one end of the metal sleeve 100 for coupling another connector, and the tongue 210 is preferably surrounded by the metal sleeve 100 and spaced apart from an inner wall of the metal sleeve 100. According to the present embodiment, an interference fitting segment 220 is extended from an edge of the circuit board 200, the tongue 210 is further extended from the interference fitting segment 220, the tongue 210 is inserted in the end of the metal sleeve 100 for coupling another connector through the neck 110 of the metal sleeve 100, and the neck 110 of the metal sleeve 100 is interference fit with the interference fitting segment 220 and the tongue 210 is thereby fixed in the end of the metal sleeve 100 for coupling another connector. The tongue 210 is the same as the aforementioned embodiment and will not be repeated, the other parts of the circuit board 200 are accommodated in and exposed the other end of the metal sleeve 100 for electrically connecting with the electronic device, the circuit board 200 could be soldered with a mother board of the electronic device, but scope of the present disclosure should not be limited to the embodiments. For example, an insulation base 300 could be stacked on a surface of the circuit board 200, multiple legs 310 could be embedded in the insulation base 300, one end of the respective legs 310 could be soldered circuit board 200 and thereby electrically connected to the respective terminals 230, and the other end of the respective legs 310 are arranged protruding from the insulation base 300 and for soldering with the mother board of the electronic device.

According to the connector having the one-piece housing of the present disclosure, the metal sleeve 100 integrally extends along its circumferential direction. Therefore, the metal sleeve 100 is seamless, and the tongue 210 is thereby ensured to be separated from electromagnetic interferences by the metal sleeve 100 to ensure efficiency and stability of the signal transmitted in the terminal 230.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the present disclosure as defined in the appended claims.

What is claimed is:
1. A connector having a one-piece housing, comprising:
a metal sleeve, the metal sleeve being open at both ends and integrally extended along a circumferential direction thereof, a cross section of one end of the metal sleeve being smaller than a cross section of another end of the metal sleeve to form a neck; and
a circuit board, a tongue being formed protruding from an edge of the circuit board and a plurality of terminals being printed on at least a surface of the tongue, a part of the circuit board being interference fit in the neck of the metal sleeve, and the tongue being accommodated in the metal sleeve, the tongue being surrounded by the metal sleeve and spaced apart from an inner wall of the metal sleeve;

wherein an interference fitting segment connected with the tongue is formed on the circuit board, the interference fitting segment is inserted in and interference fit with the neck;

wherein a notch is formed at the edge of the circuit board, and the interference fitting segment is formed in the notch and connected between the tongue and the notch.

2. The connector having the one-piece housing according to claim 1, wherein a hook is extended from the tongue.

3. The connector having the one-piece housing according to claim 1, wherein an elastic arm is arranged on the metal sleeve, and the elastic arm extends into the metal sleeve.

4. The connector having the one-piece housing according to claim 1, wherein a latch is arranged on the metal sleeve, and the latch is arranged protruding into the metal sleeve.

5. The connector having the one-piece housing according to claim 1, wherein the tongue is accommodated in one end of the metal sleeve, the neck is formed on another end of the metal sleeve, and the circuit board is disposed protruding from the metal sleeve.

6. The connector having the one-piece housing according to claim 1, wherein the neck is formed at a middle segment of the metal sleeve.

7. The connector having the one-piece housing according to claim 6, wherein the tongue is accommodated in one end of the metal sleeve, and the circuit board is accommodated in another end of the metal sleeve.

8. The connector having the one-piece housing according to claim 1, wherein the terminals are disposed on two surfaces of the tongue, and an arrangement of the terminals is compatible with USB Type C specifications.

9. The connector having the one-piece housing according to claim 1, wherein a slot is defined in the neck.

10. A connector having a one-piece housing, comprising:
a metal sleeve, the metal sleeve being open at both ends and integrally extended along a circumferential direction thereof, a cross section of one end of the metal sleeve being smaller than a cross section of another end of the metal sleeve to form a neck;
a circuit board, a tongue being formed protruding from an edge of the circuit board and a plurality of terminals being printed on at least a surface of the tongue, a part of the circuit board being interference fit in the neck of the metal sleeve, and the tongue being accommodated in the metal sleeve, the tongue being surrounded by the metal sleeve and spaced apart from an inner wall of the metal sleeve; and
an insulation base stacked on one surface of the circuit board.

11. The connector having the one-piece housing according to claim 10, wherein a plurality of legs electrically connected to the respective terminals are arranged in the insulation base.

* * * * *